United States Patent [19]

George et al.

[11] 4,264,985
[45] Apr. 28, 1981

[54] CONTINUOUS PROPAGATION STRUCTURES

[75] Inventors: Peter K. George, Morgan Hill; Tsutomu Kobayashi, Placentia, both of Calif.

[73] Assignee: Rockwell International Corporation, El Segundo, Calif.

[21] Appl. No.: 46,146

[22] Filed: Jun. 6, 1979

Related U.S. Application Data

[63] Continuation of Ser. No. 903,465, May 8, 1978, abandoned.

[51] Int. Cl.³ .............................................. G11C 19/08
[52] U.S. Cl. ...................................... 365/41; 365/37; 365/38
[58] Field of Search ....................... 365/36, 37, 38, 39, 365/41, 42

[56] References Cited

U.S. PATENT DOCUMENTS

| | | | |
|---|---|---|---|
| 3,967,002 | 6/1976 | Almasi et al. | 365/36 |
| 3,996,572 | 12/1976 | Keefe et al. | 365/36 |
| 3,996,573 | 12/1976 | Singh | 365/41 |
| 4,070,658 | 1/1978 | Giess | 365/36 |
| 4,094,006 | 6/1978 | Dimyan | 365/39 |

OTHER PUBLICATIONS

IBM Technical Disclosure Bulletin, vol. 16, No. 10, Mar. 1974, p. 3394.
IBM Technical Disclosure Bulletin, vol. 19, No. 7, Dec. 1976, pp. 2746–2747.

Primary Examiner—James W. Moffitt
Attorney, Agent, or Firm—H. Fredrick Hamman; Daniel R. McGlynn

[57] ABSTRACT

The invention is directed to continuous (gapless) propagation structures for use with magnetic bubble domain devices. The gapless structures are arranged so that magnetic bubbles will propagate therealong without a significant change in size or diameter of the bubble. In addition, the structures are configured so that the bubbles will propagate in a preferred direction without ambiguity.

13 Claims, 15 Drawing Figures

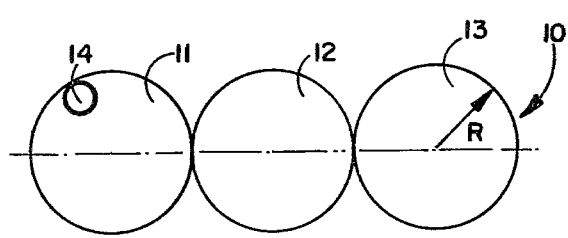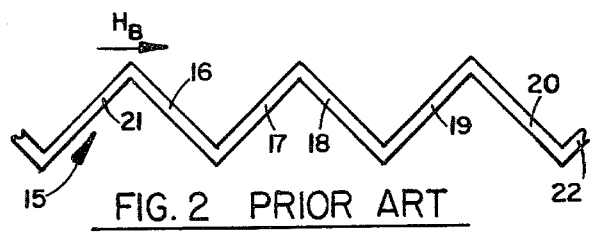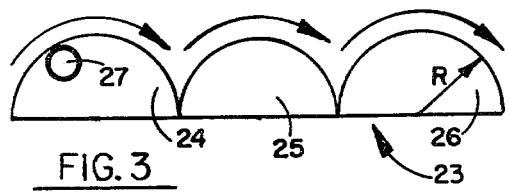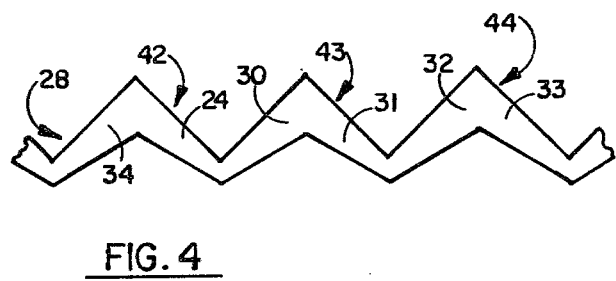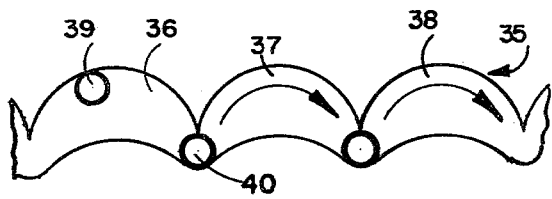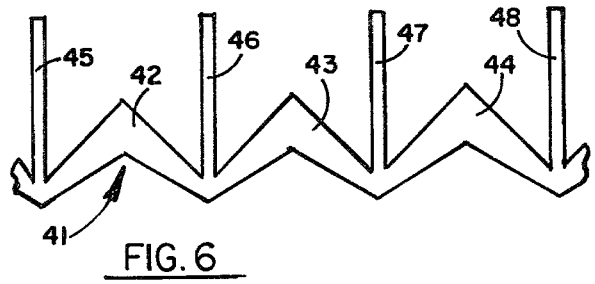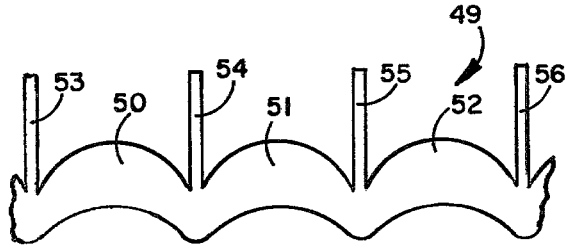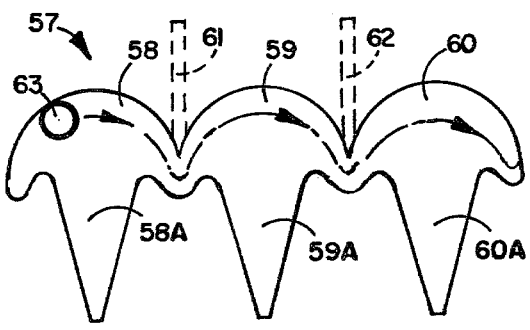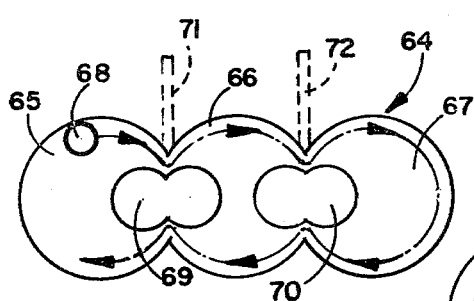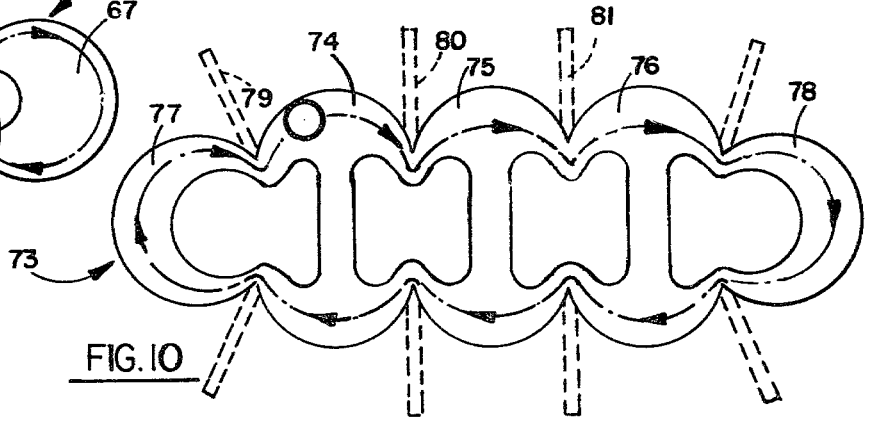

CONTINUOUS PROPAGATION STRUCTURES

This is a continuation of application Ser. No. 903,465 filed May 8, 1978 now abandoned.

BACKGROUND OF THE INVENTION

1. Field of the Invention

This invention is directed to propagation structures for magnetic bubble domain devices, in general, and to propagation structures which are continuous (i.e. gapless), in particular.

2. Background

Magnetic bubble domain devices are now established as a feasible type of technology for commercial utilization. It is projected that magnetic bubble domain devices may replace many existing devices of known technologies for example, memories. Of course, magnetic bubble domain technology is continuously undergoing evaluation and development to improve the characteristics and the operations thereof. These studies and developments include investigations of various types of propagation structures. Also, investigations have discovered that the effective drive field acting on a bubble is $H_{eff} = \beta H_{xy} - \alpha M_s$ where $\beta$ is related to the efficiency of the permalloy pattern to produce local gradients and $\alpha$ is related to the gradient produced by the magnetostatic interaction between the bubble and the permalloy pattern when no in-plane drive field is applied. In order to maximize the ratio of $\beta/\alpha$, and in this way reduce the drive field requirements, $\alpha$ must be reduced. It has been determined that for a disc $\alpha$ equals zero wherein the $\beta/\alpha$ ratio approximates infinity.

In view of technological activity directed towards reducing the size of bubbles and, thus, bubble devices, it becomes desirable to reduce the field requirements in driving small bubbles from one element in a propagation structure to the next. As a consequence, investigations are directed toward the possibility of using continuous or gapless propagation structures.

In the past, contiguous (continuous or gapless) structures have been investigated. However, most of the prior art structures have been substantially ineffective or extremely cumbersome to operate. In addition, the continuous structures have frequently exhibited very limited operational characteristics rendering the structures uneconomical or otherwise undesirable for future magnetic bubble domain devices.

PRIOR ART STATEMENT

The most pertinent prior art known to applicants is listed herewith.

U.S. Pat. No. 3,516,077; A. H. Bobeck et al; Magnetic Propagation Device Wherein Pole Patterns Move Along The Periphery Of Magnetic Disks. This patent is directed to a propagation path wherein a plurality of spaced apart disks (for example permalloy) are disposed on opposite sides of the magnetic bubble domain material in offset arrangement such that disks on one side of the bubble domain material are interposed between disks on the opposite side of the bubble domain material. In addition, a permalloy guide is provided adjacent at least one side of disks. This system is not gapless, per se.

U.S. Pat. No. 3,518,643; A. J. Perneski; Magnetic Domain Propagation Arrangement. This patent is directed to a zig-zag permalloy pattern on a magnetic bubble domain material layer for propagating bubbles from a first to a second location. A modulating bias field is required in order to force the bubbles to propagate along the path. Only undirectional propagation is permitted in the system.

U.S. Pat. No. 3,534,346; A. H. Bobeck; Magnetic Domain Propagation Arrangement. This patent is directed to a more or less zig-zag permalloy structure (FIGS. 2A–2D) with an associated conductor for moving magnetic bubbles in a magnetic domain system. The zig-zag permalloy structure includes extended tips in the form of additional curved areas which are stable areas for magnetic bubble domains.

U.S. Pat. No. 3,644,908; A. H. Bobeck; Domain-Propagation Arrangement. This patent is directed to magnetic bubble domain systems having a permalloy (or similar) overlay on each side of a magnetic bubble domain material layer. One portion of the overlay is basically an elongated bar or straight section while the other portion of the overlay is undulating or scalloped wherein bubbles are trapped and moved between the sections of overlay on each side of the magnetic domain material.

U.S. Pat. No. 3,778,788, Bobeck et al; Single Wall Domain Propagation Arrangement. This patent is directed to a domain propagation path comprising a pair of offset sawtooth permalloy sections disposed on one side of a magnetic bubble domain material layer and a conductor disposed on the other side of the layer and substantially intermediate the sawtooth portions. Bubble domains are shuttled across the conductor and along the sawtooth portions in response to electrical signal pulses on the conductor.

U.S. Pat. No. 3,828,329, R. F. Fischer et al; Single Wall Domain Propagation Arrangement. This patent is directed to a field access single wall domain propagation arrangement wherein a pattern is defined by ion implanted regions in a domain supporting layer. In FIG. 4, ion implanted regions having tangential edges are provided.

U.S. Pat. No. 3,906,468; O. Voegeli; Semicircular Magnetic Domain Propagation Apparatus. This patent is directed to an ion implanted semi-circular track in a magnetic bubble domain material wherein bubble domains are propagated along the path.

U.S. Pat. No. 3,914,751; G. E. Keefe et al; Gapless Multithickness Propagation Structure For Magnetic Domain Devices. This patent is directed to a gapless, multithickness propagation structure wherein magnetic bubbles are propagated through a bubble domain layer structure which comprises contiguous, unitary members which have varying thickness to establish bubble domain traps or locations.

U.S. Pat. No. 3,925,768; Y. S. Lin; Gapless Double-Sided Propagation Structure For Bubble Domain Devices. This patent is directed to a propagation structure wherein two identical permalloy-type disk circuits are disposed on opposite sides of magnetic bubble domains material. The disks on either side are tangential in relationship to each other. The disks on opposite sides of the bubble material layer are offset relative to each other.

U.S. Pat. No. 4,021,790; H. H. Aiken et al; Mutually Exclusive Magnetic Bubble Propagation Circuits. This patent is directed to a closed loop propagation channel wherein a plurality of closed loop zig-zag circuits are provided. Specific drive systems are required.

SUMMARY OF THE INVENTION

The invention is directed to continuous, gapless propagation structures for use with magnetic bubble domain devices. The structures are designed to have substantially identical shapes and to be joined together. The gapless structures are arranged so that magnetic bubbles will propagate therealong without a significant change in size or diameter of the bubble. In addition, the structures are configured so that the bubbles will propagate in a preferred direction without ambiguity.

BRIEF DESCRIPTION OF THE DRAWINGS

FIGS. 1 and 2 show gapless magnetic bubble domain structures known in the Prior Art.

FIGS. 3–9 represent gapless propagation structures of a general design in accordance with the instant invention.

FIGS. 10–14 represent specific devices or components which can be fabricated using the gapless structure of the instant invention.

DESCRIPTION OF A PREFERRED EMBODIMENT

Figure 11:
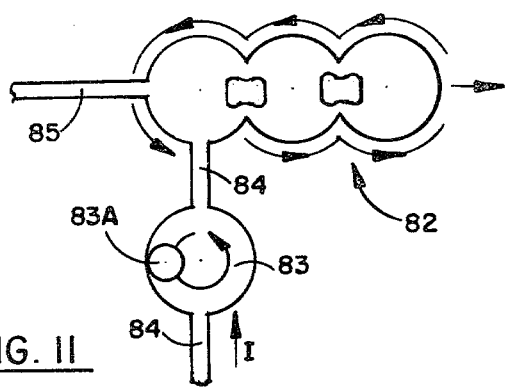

FIGS. 1 and 2 illustrate gapless type structures known in the art. FIG. 1 is representative of continuous or gapless propagation paths as shown in U.S. Pat. No. 3,828,329 to Fischer et al (noted supra). This propagation path is in the form of a plurality of tangentially contiguous discs or circular devices 11, 12 and 13. These devices can be either permalloy disks or ion-implanted areas. This device, however, is found to be of only marginal utilization inasmuch as bubble 14 may continue to rotate around a disc such as disc 11 or may arbitrarily propagate across the upper edges of discs 11, 12 and 13 (i.e. strip out) wherein control of the information in the system is lost. Some of the problems encountered in this concept are discussed in U.S. Pat. No. 3,828,329 noted above. In order to avoid some of these problems, it has been proposed to place alternate discs on opposite sides of the magnetic bubble domain layer as described in the Prior Art Statement, for example U.S. Pat. Nos. 3,516,077 and 3,925,768.

Referring now to FIG. 2, there is shown another prior art propagation arrangement of continuous configuration. Propagation structure 15 is comprised of a plurality of straight line elements or segments 16–22 which are joined together in a sawtooth or triangular configuration. This device is described in U.S. Pat. No. 3,518,643 to Pernesky (noted supra). This device has a distinct problem in that propagation path 15 (comprised of the elements 16–22) is substantially symmetrical about the vertical and horizontal axes or center lines. Consequently, in the absence of a directional modulating bias field $H_B$, the bubbles can propagate in either direction in response to the applied rotating field. Thus, propagation could proceed toward the right, in general, and arbitrarily, during a particular time period a bubble could traverse to the left for one or more cycles and segments wherein control of the information is lost and the device operation is ineffective.

The devices noted in FIGS. 1 and 2 are the basic continuous propagation structures which have been described in the art. The difficulties with these devices is well known and had led to the conclusion that totally different techniques must be utilized in order to permit gapless propagation structures to be utilized. Such radically different structures are described in U.S. Pat. Nos. 3,914,751 to Keefe et al and 3,925,768 to Lin. However, each of these approaches is extremely complicated and/or cumbersome as noted in the Prior Art Statement.

Referring now to FIG. 3, there is shown propagation path 23 comprising a plurality of elements 24, 25 and 26. These elements have the configuration of half-discs. Half-discs 24, 25 and 26 may be defined as having a radius R which is substantially similar to the radius R of discs 11, 12 and 13 shown in FIG. 1. These half-discs, in this arrangement, have a contiguous surface or point which is equivalent to the tangential portion of the discs shown in FIG. 1. However, the half-disc elements shown in FIG. 3 provide a continuous propagation path which does not suffer from the major deficiency of the prior art device shown in FIG. 1. That is, bubble 27 tends to move around the periphery of half-discs 24, 25 and 26 as suggested by the arrows adjacent thereto. However, the bubbles do not tend to continue around the periphery of the individual device. That is, the flat or straight edge of the discs presents an effective discontinuity in the bubble path and the contiguous points present effective magnetic poles for the bubbles. The devices shown in FIG. 3 exhibit an asymmetry about the center lines thereof wherein bubbles propagate in a preferred direction (in response to an in-plane rotating drive field) as controlled by the configuration of the propagation devices.

Referring now to FIG. 5, there is shown a modified version of the propagation path shown and described in FIG. 3. Propagation path 35 includes crescent shaped elements 36, 37 and 38 which are joined together at respective ends thereof. Typically, crescent elements 36, 37 and 38 are constructed with substantially the same outer radius as the half discs shown in FIG. 3. However, the crescent shaped elements include curved lower surfaces or edges which are defined by a larger radius of curvature than the outer peripheries. As shown, crescents 36, 37 and 38 are joined at the equivalent of the tangential disk portion, as shown in FIG. 3. However, because of the radius of the lower edge, the common points of the crescents are enlarged and, also, extend below the tangential point. In essence, this arrangement provides a stronger, more pronounced magnetic pole at the junction locations where a bubble, such as bubble 40 can reside, or rest, conveniently. The motion of the bubble, such as bubble 39, along the propagation path, is generally, on the outer periphery of the crescent shaped elements as described relative to the half discs in FIG. 3. However, the projections at the junction locations provide a stronger magnetic pole for the bubbles. In addition, the curvature of the lower or inner periphery of the crescents, intermediate the magnetic poles, inhibits the tendency of strip out of a bubble along the bottom surface of the devices. That is, in FIG. 3, the flat edge of the half discs sometimes permits strip out. However, the curve punctuated inner periphery of the devices shown in propagation path 35 inhibits this strip out.

Referring to FIG. 7, there is another modification of the propagation path shown and described in FIGS. 3 and 5. In particular, propagation path 49 in FIG. 7 comprises devices 50, 51, and 52 which are substantially similar to the interconnected crescents 36, 37 and 38 in FIG. 5. However, elongated bars or I-shaped devices 53, 54, 55 and 56 are joined with and formed as part of the junction between the crescents. The bars are formed as extensions of the tangential contact between the crescents shown in path 49. The I-bars tend to further accentuate the magnetic pole formed at the junction of the crescents. Consequently, bubbles can propagate along path 49 in a manner described in relation to FIGS. 3 and 5 with even greater definition and security against strip out and the like. Thus, FIGS. 3, 5 and 7 represent propagation paths 23, 35, and 49 all of which are continuous, gapless propagation paths each of which has advantages one-over-the-other as well clear advantages over the prior art.

Referring now to FIG. 4, there is shown continuous, gapless propagation path 28 which is related to the propagation path shown in FIGS. 2 and 5. That is, propagation path 28 includes a plurality of boomerang shaped elements. Each of the elements comprises two arms. For example, boomerang 42 comprises arms 24 and 34; boomerang 44 comprises elements 32 and 33. The boomerang elements define an outer periphery which is similar to the zig-zag periphery of propagation path 15 shown in FIG. 2. However, the inner periphery of the boomerang elements defines a relatively obtuse angle wherein the central peak of each boomerang is much wider than the extremities of the respective arms. These narrower extremities are joined together to provide the continuous path. This configuration is somewhat similar to the path defined in FIG. 5 wherein a plurality of crescents are illustrated. It is clear that the shape of the respective arms of the boomerang elements defines a propagation path which is asymmetrical relative to the center lines thereof. Consequently, the bubbles will tend to propagate along this path in a specified, preferred direction.

Referring to FIG. 6, there is shown a modified version of the propagation path shown in FIG. 4. In particular, propagation path 41 comprises boomerang elements 42, 43 and 44 (similar to the elements in path 28 of FIG. 4) which are joined together at the narrower extremities thereof. To this path configuration, there are added the elongated, I-shaped bars 45, 46, 47 and 48. These bars are arranged substantially transverse to the bubble propagation path and serve to emphasize the magnetic pole which is defined at the intersections of the boomerang elements to establish the bubble positions and bubble motion direction.

Referring now to FIG. 8, there is shown propagation path 57 which is related to propagation paths shown and described supra. In FIG. 8, propagation path 57 is comprised of a plurality of pick-ax devices 58, 59 and 60 joined together at the ends thereof. In fact, the pick-ax elements are basically half disc (or crescent) elements with elongated members 58A, 59A and 60A respectively. Elongated members 58A, 59A and 60A serve to provide magnetic pole enhancement which influence the propagation of bubbles 63 through path 57. The configuration of path 57 comprising pick-ax elements 58, 59 and 60 has the advantages described relative to the propagation paths described supra with the additional advantage of controlled operation provided by the elongated element 58A, 59A, and 60A. In addition, optional elongated or I-shaped bars 61 and 62 (shown dashed) can be included in the propagation path to provide enhanced magnetic pole areas.

Referring now to FIG. 9, there is shown a closed loop propagation path 64 which comprises a continuous, gapless path structure. Path 64 is comprised of elements 65, 66 and 67 which may be considered to be discs which overlap at the edges thereof, rather than in mere tangential relationship. However, portions 69 and 70 are removed from the contiguous discs. These "bow-tie" shaped apertures cause the overlapping discs to establish pole pieces at the joined areas. Thus, bubble 68 will propagate around the path 64 in the direction indicated by the arrows. Again, I-shaped elongated bars 71 and 72 (shown dashed) can be incorporated to provide enhanced magnetic pole areas in the device.

FIG. 10 shows a modified arrangement of path 64 of FIG. 9. In FIG. 10, propagation path 73 is a closed path (similar to FIG. 9) and includes elements 74, 75 and 76 which can be considered as modifications of the pick-ax elements shown in FIG. 8. However, the pick-ax elements represent, basically, parallel pick-ax paths with the elongated portions thereof superimposed upon or joined to each other. Conversely, path 73 may be considered as having a pair of substantially parallel crescent paths (such as path 35 in FIG. 5) interconnected with elongated magnetic sections to provide magnetic pole pieces. Crescent or half circle elements 77 and 78 are provided at each end of the paths to effect the path closure elements. It is clear that the path can be greatly elongated relative to the path shown in FIG. 10. In addition, the closed path need not be provided unless desired.

In addition, a plurality of elongated, I-shaped bars 79, 80 and 81 (shown dashed) can be included. These bars are disposed at the junctions of the respective elements in the propagation path. In addition, the bars are disposed at the appropriate angle to effect the magnetic pole enhancement. For example, bars 80 and 81 are substantially parallel to each other and perpendicular to the direction of motion of the bubble in the propagation path. On the other hand, bar 79 is skewed relative to bars 80 and 81 but, it is disposed nearly perpendicular to the direction of a bubble path between elements 77 and 74.

Figure 12:
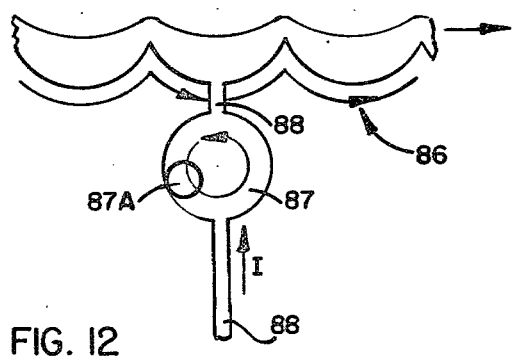

Referring now to FIGS. 11 and 12, there are shown magnetic bubble domain generators which are useful in conjunction with the continuous, gapless propagation path. In FIG. 11, propagation path 82 comprises a plurality of interlocking discs with a bow-tie aperture (see FIG. 9) which are interconnected to each other to provide the bubble domain propagation path. A separate disc 83 is disposed adjacent to path 82. Conductor 84 passes through disc 83 and is integral therewith. Consequently, bubble 83 rotates around disc 83 in the typical fashion in response to the rotating field $H_R$. When a current pulse I is supplied to conductor 84, at the appropriate time, bubble 83 strips out along conductor 84 and is transferred to propagation path 82. The operation of this kind of device is similar to the operation of other devices such as described in copending application, U.S. Ser. No. 823,318 now U.S. Pat. No. 4,198,690 by Gergis et al or U.S. Pat. No. 3,925,769, Disk Generator to P. K. George.

In the device shown in FIG. 12, bubble 87A rotates around disc 87 and is, selectively, transferred to path 86 by the application of a current pulse I on conductor 88.

Figure 13:
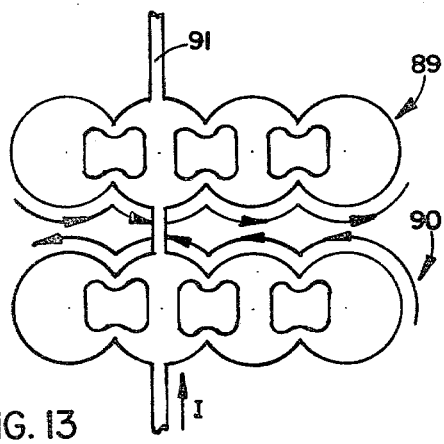

Referring now to FIG. 13, there is shown a representative transfer switch for use with the instant invention. In particular, a pair of closed propagation paths 89 and 90 are shown in juxtaposition. An integrally formed conductor 91 is provided to interconnect paths 89 and 90. Bubbles propagate along paths 89 and 90 in the typical fashion as indicated by the arrows in normal operation. However, with the application of a current pulse I to conductor 91, a bubble in path 89 and/or 90 is blocked and transferred along conductor 91 to the appropriate element in the other propagation path. Thus, he bubbles can be transferred or exchanged between propagation paths.

Figure 14:
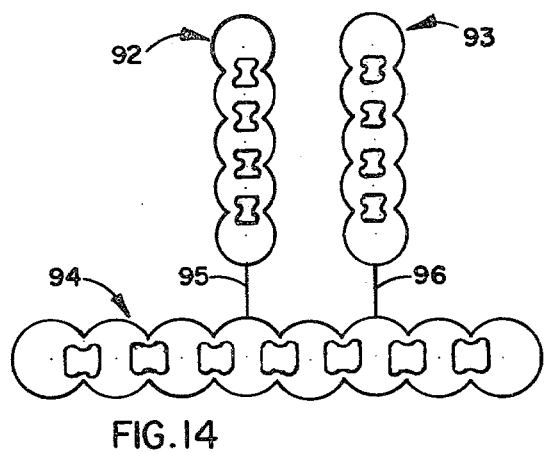

Referring now to FIG. 14, there is shown a schematic representation of a major/minor loop apparatus. Major loop 94 is associated with minor loops 92 and 93. Conductors 95 and 96 represent the transfer paths between the major and minor loops. In particular, bubbles stored in minor loops 92 and 93 can be selectively transferred therefrom to major loop 94 with the application of a current signal to conductors 95 and 96 as discussed supra. Of course, bubbles can be transferred from major loop 94 into the minor loops 92 and 93 via the same propagation path.

Figure 15:
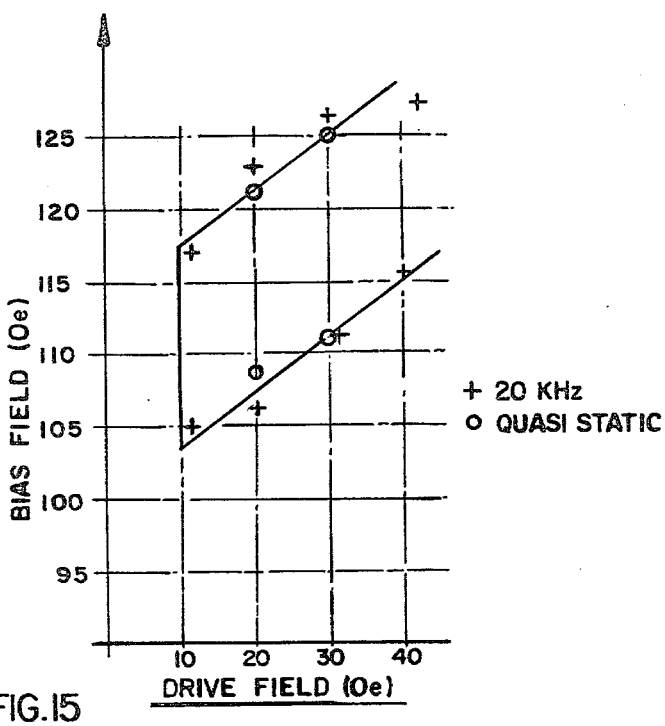
FIG. 15 is a graphical representation of the operating characteristics of the structures shown in FIGS. 3–14.

Referring now to FIG. 15, there is shown an operational diagram for the devices shown and described supra. In particular, the graph shown in FIG. 15 represents the margin diagram for basic propagation in the devices. The diagram shown in FIG. 15 plots the drive field (in Oersteds) versus the bias field (in Oersteds) for 20 KHz (+) operation as well as for the quasistatic (o) operation. The diagram shown in FIG. 15 is largely directed to the devices shown in FIG. 5. The margin characteristic is believed to be even better when a device such as shown in FIG. 7, i.e. including the vertical stabilizer bars, it utilized. That is, the stabilizer bars as noted, inhibit the horizontal strip out of a bubble across many bits which has the effect of causing a loss of bottom margin.

Thus, there has been shown and described a preferred embodiment of the instant invention. The invention provides a continuous, gapless propagation path wherein the components are joined together and are configured to have asymmetrical shapes relative to the center line of the propagation path. The asymmetrical path defines magnetic poles which enhance the bubble stability and propagation. In addition, stabilizer bars can be utilized to further enhance the magnetic bubble domain propagation of the device.

Furthermore, closed magnetic domain propagation paths, magnetic bubble domain generators with such paths, transfer switches with said paths and a major/minor loop configuration using the continuous, gapless propagation paths are also defined. The devices shown and described are intended to be for illustrative purposes only. The designs shown are not intended to be limitative of the invention. Rather, the scope of the invention is to be defined only by the claims appended hereto.

Having thus described a preferred embodiment of the invention, what is claimed is:

1. A gapless propagation path for magnetic bubble domains comprising:
    a plurality of magnetic bubble domain device guide elements having substantially the same configuration and joined to each other so as to form a continuous path;
    each of said guide elements having a first generally arcuate peripheral edge which is displaced in the same general direction away from the nominal line of bubble propagation; a substantially triangle shaped protruding second peripheral edge opposite said first peripheral edge, said second edge including a protruding portion displaced in a direction opposite that of said first peripheral edge, said protruding edge forming first magnetic pole enhancing members at intermediate locations adjacent said second peripheral edge of said guide elements;
    each of said guide elements having an asymmetrical configuration wherein said first and second peripheral edges are closer together at the locations where the guide elements are joined to each other than at locations intermediate the locations of joinder, whereby magnetic bubble domains move in a preferred direction relative to said guide elements in response to a driving field while the size of said magnetic bubble domains remains substantially constant.

2. The gapless propagation path recited in claim 1, wherein said guide elements are substantially arcuate in configuration.

3. The gapless propagation path recited in claim 1, including
    second magnetic pole enhancing members disposed at the locations where said patterns are joined together adjacent the outer peripheral edges of said patterns.

4. The gapless propagation path recited in claim 1, wherein
    said first magnetic pole enhancing members of different ones of said guide elements are joined together.

5. The gapless propagation path recited in claim 1, further comprising;
    further guide elements connected to join together two substantially linear gapless propagation paths into a continuous closed gapless propagation path loop.

6. The gapless propagation path recited in claim 1, including
    means for supplying magnetic bubble domains to said patterns.

7. The gapless propagation path recited in claim 1, including
    means for transferring magnetic bubble domains to or from said path in response to a control signal.

8. A gapless propagation path for magnetic bubble domains comprising:
    a plurality of magnetic bubble domain device guide elements having substantially the same configuration and joined to each other so as to form a continuous path;
    each of said guide elements having a first peripheral edge which is displaced in the same general direction away from the nominal line of bubble propagation; a second substantially recessed peripheral edge opposite said first peripheral edge and displaced in said same general direction; and a line of symmetry located intermediate the locations of joinder;
    each of said guide elements having a symmetrical configuration with respect to the line of symmetry, such that the cross-sectional width of each of said guide elements in a direction substantially normal to the nominal line of bubble propagation continuously decreases in a direction from the line of symmetry to the location where the guide elements are joined to each other, whereby magnetic bubble domains move in a preferred direction relative to said guide elements in response to a driving field while the size of said magnetic bubble domains remains substantially constant.

9. The gapless propagation path recited in claim 2, wherein said guide elements are substantially arcute in configuration, said first peripheral edge being an arc of a circle having a first radius, said second peripheral edge being an arc of a circle having a second radius smaller than said first radius.

10. The gapless propagation path recited in claim 8, wherein said guide elements are substantially boomerang shaped.

11. The gapless propagation path recited in claim 8, further comprising:
   first magnetic pole enhancing members disposed at the locations where said patterns are joined together adjacent the outer peripheral edges of said patterns.

12. The gapless propagation path recited in claim 8, wherein
   said first magnetic pole enhancing members comprise rectangular bars extending in said same general direction as said first peripheral edge.

13. The gapless propagation path recited in claim 12, further comprising:
   further guide elements connected to join together two substantially linear gapless propagation paths into a continuous closed gapless propagation path loop.

* * * * *

UNITED STATES PATENT AND TRADEMARK OFFICE
CERTIFICATE OF CORRECTION

PATENT NO. : 4,264,985

DATED : April 28, 1981

INVENTOR(S) : Peter K. George et al

It is certified that error appears in the above-identified patent and that said Letters Patent are hereby corrected as shown below:

In column 2, line 2 delete [undirectional] and insert --unidirectional--.

In column 6, lines 53 and 54, delete [copending application, U. S. Serial No. 823,318 now].

Signed and Sealed this

First Day of December 1981

[SEAL]

Attest:

GERALD J. MOSSINGHOFF

Attesting Officer    Commissioner of Patents and Trademarks